(12) United States Patent
Yoshimoto

(10) Patent No.: US 9,109,288 B2
(45) Date of Patent: Aug. 18, 2015

(54) GAS SUPPLY SYSTEM

(75) Inventor: Osamu Yoshimoto, Osaka (JP)

(73) Assignee: TOYO TANSO CO., LTD., Osaka-shi (JP)

( * ) Notice: Subject to any disclaimer, the term of this patent is extended or adjusted under 35 U.S.C. 154(b) by 238 days.

(21) Appl. No.: 13/393,895

(22) PCT Filed: Sep. 2, 2010

(86) PCT No.: PCT/JP2010/005418
§ 371 (c)(1),
(2), (4) Date: Mar. 2, 2012

(87) PCT Pub. No.: WO2011/027565
PCT Pub. Date: Mar. 10, 2011

(65) Prior Publication Data
US 2012/0160358 A1    Jun. 28, 2012

(30) Foreign Application Priority Data

Sep. 4, 2009 (JP) ................ 2009-205162

(51) Int. Cl.
*F16K 11/20* (2006.01)
*C23C 16/455* (2006.01)
*F17C 5/00* (2006.01)

(52) U.S. Cl.
CPC ............. *C23C 16/45561* (2013.01); *F17C 5/00* (2013.01); *F17C 2205/0142* (2013.01);
(Continued)

(58) Field of Classification Search
CPC ................ C23C 16/45561; F17C 2205/0142; F17C 2205/0323; F17C 2250/03; F17C 5/00; F17C 2205/043; F17C 2205/01; F16K 11/10
USPC ............. 137/627.5, 628, 594, 597, 861, 862, 137/870, 872, 874, 613; 141/47, 95
See application file for complete search history.

(56) References Cited

U.S. PATENT DOCUMENTS 6,012,478 A  *  1/2000  Park ........................... 137/240
6,604,555 B2 *  8/2003  Blatt et al. .................... 141/21
(Continued)

FOREIGN PATENT DOCUMENTS

CN        101329998 A       12/2008
CN        101379592 A        3/2009
(Continued)

OTHER PUBLICATIONS

International Search Report Issued Nov. 9, 2010 in PCT/JP10/05418 Filed Sep. 2, 2010.
(Continued)

*Primary Examiner* — Jessica Cahill
(74) *Attorney, Agent, or Firm* — Oblon, McClelland, Maier & Neustadt, L.L.P.

(57) ABSTRACT

A fluorine gas generation system includes a plurality of fluorine gas supply systems and a controller. Each of the fluorine gas supply systems includes a fluorine gas generation apparatus. Each of the fluorine gas supply systems is connected to a CVD device group. The fluorine gas generation apparatus includes a fluorine gas generator and a buffer tank. An opening/closing valve is inserted through a piping. The other end of the piping is branched into a plurality of pipings. Each of the pipings is connected to CVD devices. Pipings in the adjacent fluorine gas supply systems are connected to each other via a piping. An opening/closing valve is inserted through each of the pipings.

10 Claims, 9 Drawing Sheets

(52) U.S. Cl.
CPC ..... *F17C2205/0323* (2013.01); *F17C 2221/01* (2013.01); *F17C 2250/03* (2013.01); *F17C 2250/043* (2013.01); *Y10T 137/877* (2015.04)

(56) References Cited

U.S. PATENT DOCUMENTS

| | | | |
|---|---|---|---|
| 6,779,568 B2 * | 8/2004 | Borck | 141/67 |
| 6,955,198 B2 * | 10/2005 | Wodjenski | 141/248 |
| 7,556,678 B2 | 7/2009 | Hayakawa et al. | |
| 2003/0047445 A1 | 3/2003 | Tojo et al. | |
| 2004/0055874 A1 * | 3/2004 | Hiraiwa et al. | 204/250 |
| 2005/0051233 A1 | 3/2005 | Wodjenski | |
| 2005/0224366 A1 | 10/2005 | Hodgson et al. | |
| 2006/0032550 A1 | 2/2006 | Wodjenski | |
| 2007/0160447 A1 | 7/2007 | Amikura et al. | |
| 2007/0235085 A1 * | 10/2007 | Nakashima et al. | 137/240 |
| 2008/0173353 A1 | 7/2008 | Chen et al. | |
| 2010/0064969 A1 | 3/2010 | Hiraiwa et al. | |

FOREIGN PATENT DOCUMENTS

| | | |
|---|---|---|
| EP | 2 012 345 A1 | 1/2009 |
| JP | 2002 339090 | 11/2002 |
| JP | 2003 257870 | 9/2003 |
| JP | 2004 11001 | 1/2004 |
| JP | 2005 533925 | 11/2005 |
| JP | 2007 211261 | 8/2007 |

OTHER PUBLICATIONS

Office Action issued Aug. 20, 2013, in Japanese Patent Application No. 2009-205162 with English translation.

Extended Search Report issued Apr. 22, 2013 in European Application No. 10813516.1.

Combined Office Action and Search Report issued Jul. 23, 2013 in Chinese Application No. 201080039189.5 (With English Translation and English Translation of Category of Cited Documents).

* cited by examiner

GAS SUPPLY SYSTEM

TECHNICAL FIELD

The present invention relates to a gas supply system.

BACKGROUND ART

In steps for manufacturing semiconductors, CVD (Chemical Vapor Deposition) devices that form thin films such as silicon thin films on substrates, for example, have been used. In order to perform processing such as cleaning of substrates using gases (e.g., fluorine gases) in the CVD devices, gas generation apparatuses that generate the gases are connected to the CVD devices.

In a semiconductor manufacturing plant discussed in Patent Document 1, for example, a plurality of fluorine gas generation apparatuses, a plurality of CVD devices, and a storage tank are connected to one another via pipings. More specifically, the plurality of pipings extending from each of the plurality of fluorine gas generation apparatuses are joined together and connected to the storage tank. The one piping extending from the storage tank is branched into a plurality of pipings, and the plurality of pipings are respectively connected to the plurality of CVD devices. In this case, the fluorine gases generated in the plurality of fluorine gas generation apparatuses are stored in the storage tank once via the common piping. The fluorine gas stored in the storage tank is supplied to each of the CVD devices through the common piping.

In the above-mentioned semiconductor manufacturing plant, when a problem occurs in the one fluorine gas generation apparatus by providing the storage tank, the one fluorine gas generation apparatus can be repaired without stopping the other fluorine gas generating apparatuses that are operating.
[Patent Document 1] JP 2007-211261 A

SUMMARY OF INVENTION

Technical Problem

Generally when a part or a piping in a fluorine gas generation apparatus is dilapidated, a metal such as iron, nickel, or copper may be exposed in the fluorine gas generation apparatus or the piping. In this case, the fluorine gas reacts with the metal such as iron, nickel, or copper in the fluorine gas generation apparatus or in the piping so that metal fluoride may be generated. The metal fluoride is mixed into the fluorine gas as a gas or a particle. When the fluorine gas including the metal fluoride the amount of which exceeds an allowable amount is sent to a CVD device, metal contamination of a substrate occurs in the CVD device. In this case, an operation of the fluorine gas generation apparatus is required to be stopped, to maintain the fluorine gas generation apparatus and the CVD device.

In the above-mentioned semiconductor manufacturing plant, however, the fluorine gases generated in the plurality of fluorine gas generation apparatuses are supplied to the plurality of CVD devices through the common piping. When metal contamination occurs in any one of the CVD devices, it cannot be specified which of the plurality of fluorine gas generation apparatuses causes the metal contamination. Therefore, operations of all the fluorine gas generation apparatuses including the fluorine gas generation apparatus that has caused the metal contamination are required to be stopped to maintain all the fluorine gas generation apparatuses. As a result, the efficiency of the maintenance is significantly reduced. Since the operations of all the fluorine gas generation apparatuses are stopped, processing of the substrates in all the CVD devices is required to be stopped. Therefore, the operation efficiency of the CVD device is also reduced.

An object of the present invention is to provide a gas supply system in which an area where a defect has occurred becomes easy to be specified so that the efficiency of maintenance at the time of occurrence of an abnormality is improved while the efficiency of processing using a gas is prevented from being reduced.

Solution to Problem (1) According to an aspect of the present invention, a gas supply system that supplies gases to a plurality of processing devices that respectively perform processing using the gases includes a plurality of first gas generation apparatuses that respectively generate gases, a plurality of first pipings respectively connected to the plurality of first gas generation apparatuses for supplying the gas generated by the plurality of first gas generation apparatuses to the plurality of processing devices, a plurality of first opening/closing units respectively provided in the plurality of first pipings for opening and closing flow paths, a second piping connected between each of the first pipings and the other first piping, and a second opening/closing unit provided in the second piping for opening and closing a flow path.

In the gas supply system, when the plurality of first opening/closing units are in the open state and the second opening/closing unit is in the closed state, the gas generated by the plurality of first gas generation apparatuses is supplied to the plurality of processing devices through the plurality of first pipings. In this state, when a defect has occurred in the processing in any one of the processing devices due to an abnormality in any one of the plurality of first gas generation apparatuses, it can be easily specified in which of the first gas generation apparatuses the abnormality has occurred. Therefore, the first gas generation apparatus to be maintained can be easily specified.

In this case, the first opening/closing unit corresponding to the first gas generation apparatus in which the abnormality has occurred is brought into the closed state and the second opening/closing unit is brought into the open state so that the supply of the gas from the first gas generation apparatus in which the abnormality has occurred to the processing device in which the defect has occurred can be stopped while the gas can be supplied from the other first gas generation apparatus that is normal to the processing device in which the defect has occurred through the second piping. Therefore, the first gas generation apparatus in which the abnormality has occurred is maintained while the processing can be continued in the processing device in which the defect has occurred due to the abnormality in the first gas generation apparatus.

As a result, an area where the defect has occurred becomes easy to be specified so that the efficiency of the maintenance of the first gas generation apparatus at the time of the occurrence of the abnormality can be improved while the efficiency of the processing using the gases in the plurality of processing devices can be prevented from being reduced.

(2) The gas supply system may further include a controller that controls opening and closing of each of the first opening/closing units and the second opening/closing unit, and the controller may be configured to bring, when the first opening/closing unit provided in one of the plurality of first pipings is brought into a closed state, the second opening/closing unit into an open state so that the gas is supplied to the processing device connected to the one first piping from the first gas generation apparatus connected to the other first piping.

In this case, when the controller brings the first opening/closing unit provided in one of the plurality of first pipings into the closed state, the second opening/closing unit is brought into the open state so that the gas is supplied to the processing device connected to the one first piping from the first gas generation apparatus connected to the other first piping. Therefore, the supply of the gas from the first gas generation apparatus in which the abnormality has occurred to the processing device is stopped while the gas is supplied from the other first gas generation apparatus that is normal to the processing device.

(3) The controller may be configured to bring, when the first opening/closing unit provided in the one first piping is brought into a closed state, the second opening/closing unit into an open state when pressure on the upstream side of the second opening/closing unit becomes higher than pressure on the downstream side thereof.

In this case, the gas is reliably prevented from flowing back from the processing device in which the defect due to the abnormality in the first gas generation apparatus has occurred to the first gas generation apparatus that is normal.

(4) According to another aspect of the present invention, a gas supply system that supplies gases to a plurality of processing devices that respectively perform processing using the gases includes a plurality of first gas generation apparatuses that respectively generate gases, a plurality of first pipings respectively connected to the plurality of first gas generation apparatuses for supplying the gas generated by the plurality of first gas generation apparatuses to the plurality of processing devices, a plurality of first opening/closing units respectively provided in the plurality of first pipings for opening and closing flow paths, a second gas generation apparatus that is provided in common among the plurality of processing devices and generates a gas, a plurality of third pipings that respectively supply the gas generated by the second gas generation apparatus to the plurality of processing devices, and a plurality of third opening/closing units respectively provided in the plurality of third pipings for opening and closing flow paths.

In the gas supply system, when the plurality of first opening/closing units are in the open state and the third opening/closing unit is in the closed state, the gas generated by the plurality of first gas generation apparatuses is supplied to the plurality of processing devices through the plurality of first pipings. In this state, when a defect has occurred in the processing in any one of the processing devices due to an abnormality in any one of the plurality of first gas generation apparatuses, it can be easily specified in which of the first gas generation apparatuses the abnormality has occurred.

In this case, the first opening/closing unit corresponding to the first gas generation apparatus in which the abnormality has occurred is brought into the closed state and the third opening/closing unit is brought into the open state so that the supply of the gas from the first gas generation apparatus in which the abnormality has occurred to the processing device in which the defect has occurred can be stopped while the gas can be supplied from the second gas supply apparatus to the processing device in which the abnormality has occurred through the third piping. Therefore, the first gas generation apparatus in which the abnormality has occurred is maintained while the processing can be continued in the processing device in which the defect has occurred due to the abnormality in the first gas generation apparatus.

As a result, an area where the defect has occurred becomes easy to be specified so that the efficiency of the maintenance of the first gas generation apparatus at the time of the occurrence of the abnormality can be improved while the efficiency of the processing using the gases in the plurality of processing devices can be prevented from being reduced.

(5) The gas supply system may further include a controller that controls an opening/closing operation of each of the plurality of first opening/closing units and the plurality of third opening/closing units, and the controller may be configured to bring, when the first opening/closing unit provided in one of the plurality of first pipings is brought into a closed state, the third opening/closing unit corresponding to the one first piping into an open state so that the gas is supplied from the second gas generation apparatus to the processing devices connected to the one first piping.

In this case, when the controller brings the first opening/closing unit provided in one of the plurality of first pipings into the closed state, the third opening/closing unit corresponding to the one first piping is brought into the open state so that the gas is supplied from the second gas generation apparatus to the processing device connected to the one first piping. Therefore, the supply of the gas from the first gas generation apparatus in which the abnormality has occurred to the processing device is stopped while the gas is supplied from the second gas generation apparatus to the processing device.

(6) According to still another aspect of the present invention, a gas supply system that supplies gases to a plurality of processing devices that respectively perform processing using the gases includes a plurality of first gas generation apparatuses that respectively generate gases, a plurality of first pipings respectively connected to the plurality of first gas generation apparatuses for supplying the gas generated by the plurality of first gas generation apparatuses to the plurality of processing devices, a plurality of first opening/closing units respectively provided in the plurality of first pipings for opening and closing flow paths, a third gas generation apparatus that is provided in common among the plurality of processing devices and generates a gas, a fourth piping connected to the third gas generation apparatus, a plurality of fifth pipings respectively connected between the fourth piping and portions, on the downstream side of the plurality of first opening/closing units, of the plurality of first pipings, and a plurality of fourth opening/closing units respectively provided in the plurality of fifth pipings for opening and closing flow paths.

In the gas supply system, when the plurality of first opening/closing units are in the open state and the fourth opening/closing unit is in the closed state, the gas generated by the plurality of first gas generation apparatuses is supplied to the plurality of processing devices through the plurality of first pipings. In this state, when a defect has occurred in the processing in any one of the processing devices due to an abnormality in any one of the plurality of first gas generation apparatuses, it can be easily specified in which of the first gas generation apparatuses the abnormality has occurred. Therefore, the first gas generation apparatus to be maintained can be easily specified.

In this case, the first opening/closing unit corresponding to the first gas generation apparatus in which the abnormality has occurred is brought into the closed state and the fourth opening/closing unit is brought into the open state so that the supply of the gas from the first gas generation apparatus in which the abnormality has occurred to the processing device in which the defect has occurred can be stopped while the gas can be supplied from the third gas supply apparatus to the processing device in which the defect has occurred through the fourth and fifth pipings. Therefore, the first gas generation apparatus in which the abnormality has occurred is maintained while the processing can be continued in the processing device in which the defect has occurred due to the abnormality in the first gas generation apparatus.

As a result, an area where the defect has occurred becomes easy to be specified so that the efficiency of the maintenance of the first gas generation apparatus at the time of the occurrence of the abnormality can be improved while the efficiency of the processing using the gases in the plurality of processing devices can be prevented from being reduced.

(7) The gas supply system may further include a controller that controls an opening/closing operation of each of the first opening units and the plurality of fourth opening units, and the controller may be configured to bring, when the first opening/closing unit provided in one of the plurality of first pipings is brought into a closed state, the fourth opening/closing unit corresponding to the one first piping into an open state so that the gas is supplied from the third gas generation apparatus to the processing devices connected to the one first piping.

In this case, when the controller brings the first opening/closing unit provided in one of the plurality of first pipings into the closed state, the fourth opening/closing unit corresponding to the one first piping is brought into the open state so that the gas is supplied from the third gas generation apparatus to the processing device connected to the one first piping. Therefore, the supply of the gas from the first gas generation apparatus in which the abnormality has occurred to the processing device is stopped while the gas is supplied from the third gas generation apparatus to the processing device.

(8) The controller may be configured to bring, when the first opening/closing unit provided in the one first piping is brought into a closed state, the fourth opening/closing unit corresponding to the one first piping into an open state when pressure on the upstream side of the fourth opening/closing unit corresponding to the one first piping becomes higher than pressure on the downstream side thereof.

In this case, the gas can be reliably prevented from flowing back from the processing device in which the defect due to the abnormality in the first gas generation apparatus has occurred to the third gas generation apparatus.

(9) The controller may be configured to bring, when the fourth opening/closing unit corresponding to the one first piping is brought into an open state, the fourth opening/closing unit corresponding to the other first piping into an open state so that the gas is supplied to the processing device connected to the one first piping from the first gas generation apparatus connected to the other first piping when pressure in the fourth piping is lower than a predetermined value.

In this case, when the controller brings the fourth opening/closing unit corresponding to one of the plurality of first pipings into the open state, the fourth opening/closing unit corresponding to the other first piping is brought into the open state so that the gas is supplied to the processing device connected to the one first piping from the first gas generation apparatus connected to the other first piping when the pressure in the fourth piping is lower than the predetermined value. If the supply capability of the gas from the third gas generation apparatus to the processing device in which the defect has occurred is insufficient, the gas is automatically supplied from the other first gas generation apparatus to the processing device. As a result, the other first gas generation apparatus can compensate for the supply capability of the third gas generation apparatus.

(10) The controller may be configured to bring, when the fourth opening/closing unit corresponding to the one first piping is brought into an open state, the fourth opening/closing unit corresponding to the other first piping into an open state when pressure on the upstream side of the fourth opening/closing unit corresponding to the other first piping becomes higher than pressure on the downstream side thereof.

In this case, the gas can be reliably prevented from flowing back from the processing device in which the defect due to the abnormality in the first gas generation apparatus has occurred to the first gas generation apparatus that is normal.

Advantageous Effects of Invention

According to the present invention, a first gas generation apparatus to be maintained can be specified. The first gas generation apparatus in which the abnormality has occurred is maintained while processing can be continued in a processing device in which a defect due to an abnormality in the first gas generation apparatus has occurred. As a result, an area where the defect has occurred becomes easy to be specified so that the efficiency of the maintenance of the first gas generation apparatus at the time of the occurrence of the abnormality can be improved while the efficiency of processing using gases in a plurality of processing devices can be prevented from being reduced.

DESCRIPTION OF EMBODIMENTS

Figure 1:
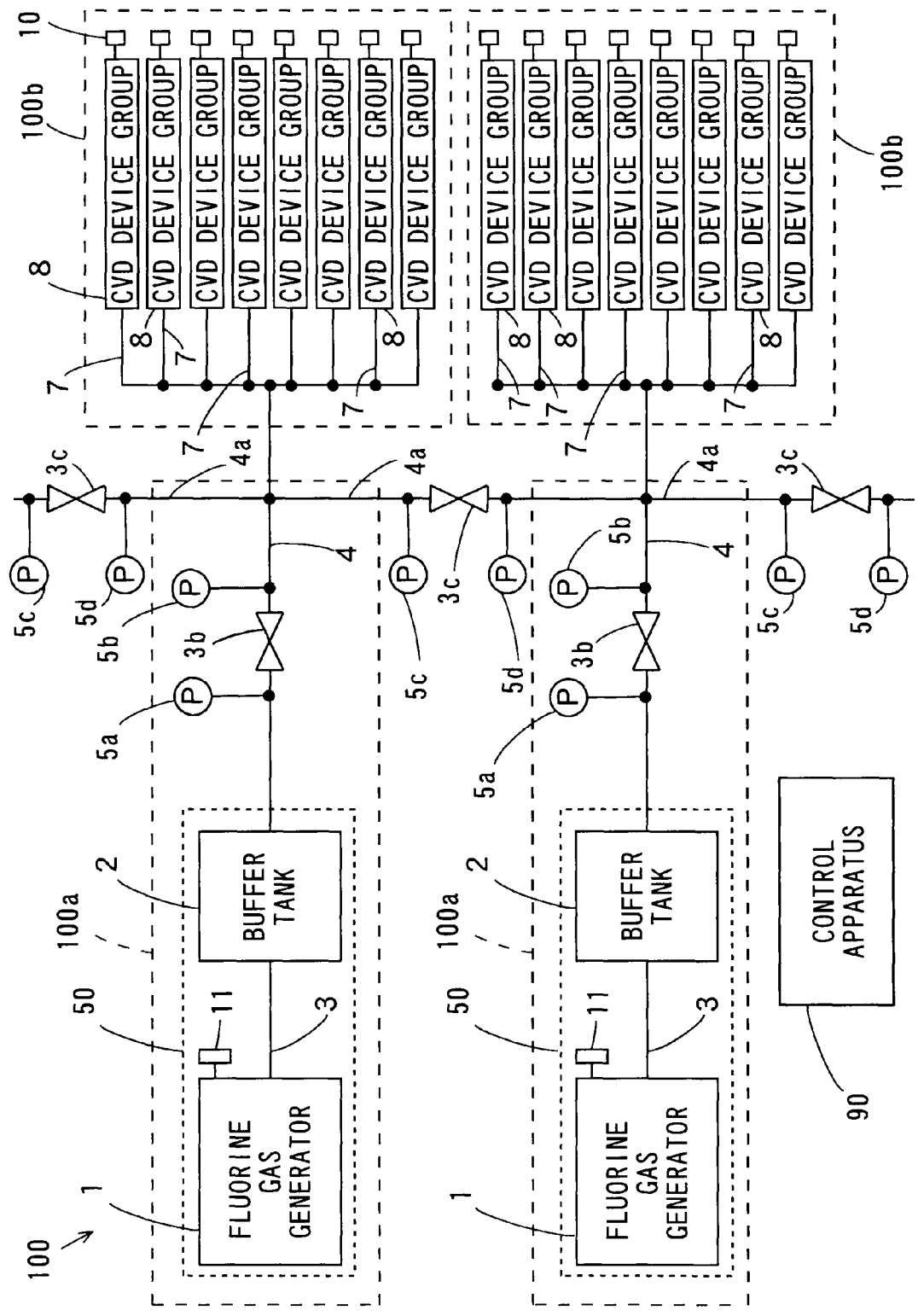
FIG. 1 is a schematic view illustrating a configuration of a fluorine gas supply system according to a first embodiment.

The embodiments of the present invention will be described in detail referring to the drawings. The embodiments below describe a fluorine gas supply system that generates a fluorine gas as an example of a gas supply system.

(1) First Embodiment (1-1) Configuration of Fluorine Gas Supply System

FIG. 1 is a schematic view illustrating a configuration of a fluorine gas supply system 100 according to a first embodiment. As illustrated in FIG. 1, the fluorine gas supply system 100 includes a plurality of fluorine gas supply systems 100a and a controller 90. Each of the fluorine gas supply systems 100a is connected to a CVD device group 100b including a plurality of (eight in this example) CVD (Chemical Vapor Deposition) devices.

Each of the fluorine gas supply systems 100a includes a fluorine gas generation apparatus 50. The fluorine gas generation apparatus 50 includes a fluorine gas generator 1 and a buffer tank 2. The fluorine gas generator 1 and the buffer tank 2 are connected to each other via a piping 3.

Each of the fluorine gas generators 1 includes an electrolyzer where an electrolytic bath composed of a KF—HF based mixed molten salt, for example, is formed. HF (Hydrogen Fluoride) is electrolyzed within the electrolytic bath so that a fluorine gas is generated. The fluorine gas generated by the fluorine gas generator 1 is fed to the buffer tank 2 via the piping 3, and is stored therein. An opening/closing valve may be inserted through the piping 3. In this case, timing at which the fluorine gas is supplied from the fluorine gas generator 1 to the buffer tank 2 can be controlled while the fluorine gas can be prevented from flowing back from the buffer tank 2 to the fluorine gas generator 1.

An abnormality detection sensor 11 is attached to each of the fluorine gas generation apparatuses 50. The abnormality detection sensor 11 detects an abnormality in the fluorine gas generation apparatus 50. The abnormality in the fluorine gas generation apparatus 50 includes leakage of the fluorine gas to the exterior or an abnormality in an electrical system.

One end of a piping 4 is connected to the buffer tank 2 in each of the fluorine gas generation apparatuses 50. An opening/closing valve 3b is inserted through the piping 4. Pressure gauges 5a and 5b are respectively attached to portions, on one side and the other side of the opening/closing valve 3b, of the piping 4.

The other end of the piping 4 is branched into a plurality of (eight in this example) pipings 7. Each of the pipings 7 is connected to the CVD device 8 in the CVD device group 100b.

The pipings 4 in the adjacent fluorine gas supply systems 100a are connected to each other via a piping 4a. Thus, the plurality of fluorine gas supply systems 100a are connected to each other via the pipings 4 and 4a. An opening/closing valve 3c is inserted through each of the pipings 4a. Pressure gauges 5c and 5d are respectively attached to portions, on one side and the other side of the opening/closing valve 3c, of the piping 4a.

Each of the CVD devices 8 processes a substrate using the fluorine gas. An abnormality detection sensor 10 is attached to each of the CVD devices 8. The abnormality detection sensor 10 detects the occurrence of metal contamination of the substrate in the CVD device 8.

The controller 90 includes a CPU (Central Processing Unit) and a memory or a microcomputer, and controls an operation of each of constituent elements of the fluorine gas supply system 100. In the present embodiment, when the metal contamination occurs, the controller 90 switches a supply path of the fluorine gas. Details of a control operation of the controller 90 will be described below.

A cause of the occurrence of the metal contamination in the CVD device 8 will be described below. A metal may be exposed within the fluorine gas generation apparatus 50 or the piping 4 or 4a because a part in the fluorine gas generation apparatus 50 or the piping 4 or 4a is dilapidated, for example. The fluorine gas and the metal react within the fluorine gas generation apparatus 50 or within each of the pipings 4 and 4a so that metal fluoride is generated. In this case, the metal fluoride, together with the fluorine gas, is supplied to the CVD device 8. Thus, in the CVD device 8, the fluorine gas including the metal fluoride is supplied to the substrate so that the metal contamination of the substrate occurs. Thus, the metal contamination occurs in the CVD device 8 due to the abnormality in the fluorine gas supply system 100a. Therefore, the inside of the fluorine gas generation apparatus 50 and each of the pipings 4 and 4a are required to be maintained at the time of the occurrence of the metal contamination. The maintenance includes cleaning or part replacement.

(1-2) Control System of Fluorine Gas Supply System

Figure 2:
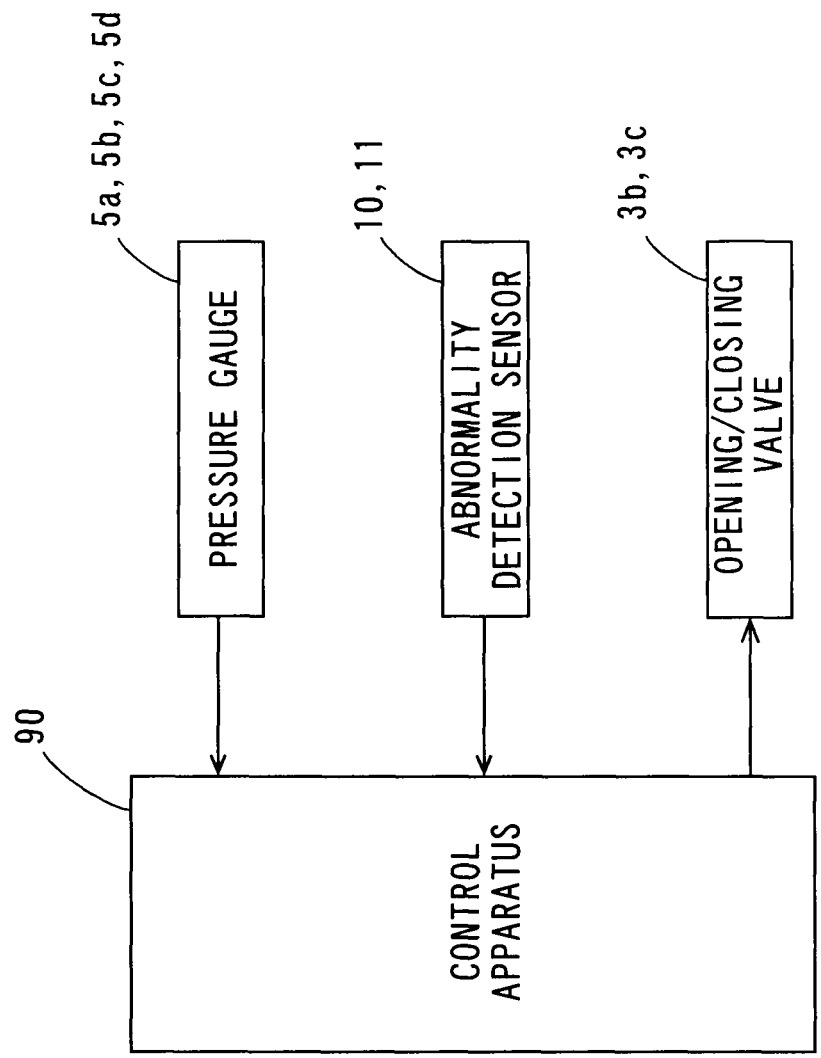
FIG. 2 is a block diagram illustrating a part of a control system in the fluorine gas supply system according to the first embodiment.

FIG. 2 is a block diagram illustrating a part of a control system in the fluorine gas supply system 100 illustrated in FIG. 1. As illustrated in FIG. 2, output signals of the pressure gauges 5a to 5d and the abnormality detection sensors 10 and 11 are fed to the controller 90. The controller 90 controls the opening/closing valves 3b and 3c based on the output signals fed from the pressure gauges 5a to 5d and the abnormality detection sensors 10 and 11.

(1-3) Control of Opening/Closing Valve

In the present embodiment, the controller 90 performs supply path switching processing, described below, when the fluorine gas supply system 100 operates. Thus, a fluorine gas supply path is switched depending on whether the fluorine gas supply system 100a is normal or an abnormality has occurred in the fluorine gas supply system 100a.

If all the fluorine gas supply systems 100a are normally operating, all the opening/closing valves 3b are opened while all the opening/closing valves 3c are closed. Thus, the fluorine gas generated by each of the fluorine gas generation apparatuses 50 in all the fluorine gas supply system 100a is supplied to the plurality of CVD devices 8 through the pipings 4 and 7.

When the supply of the fluorine gas from the fluorine gas generation apparatus 50 to the plurality of CVD devices 8 is started in each of the fluorine gas supply systems 100a, the opening/closing valve 3b is opened with a measurement value of the pressure gauge 5a being higher than a measurement value of the pressure gauge 5b. Thus, the fluorine gas is prevented from flowing back to the fluorine gas generation apparatus 50.

On the other hand, if the abnormality has occurred in any one of the fluorine gas supply systems 100a, the corresponding opening/closing valve 3b is selectively closed while the corresponding opening/closing valve 3c is selectively opened. Thus, the fluorine gas generated by the fluorine gas generation apparatus 50 in the normal fluorine gas supply system 100a is supplied to the plurality of CVD devices 8 connected to the abnormal fluorine gas supply system 100a through the pipings 4a.

Figure 3:
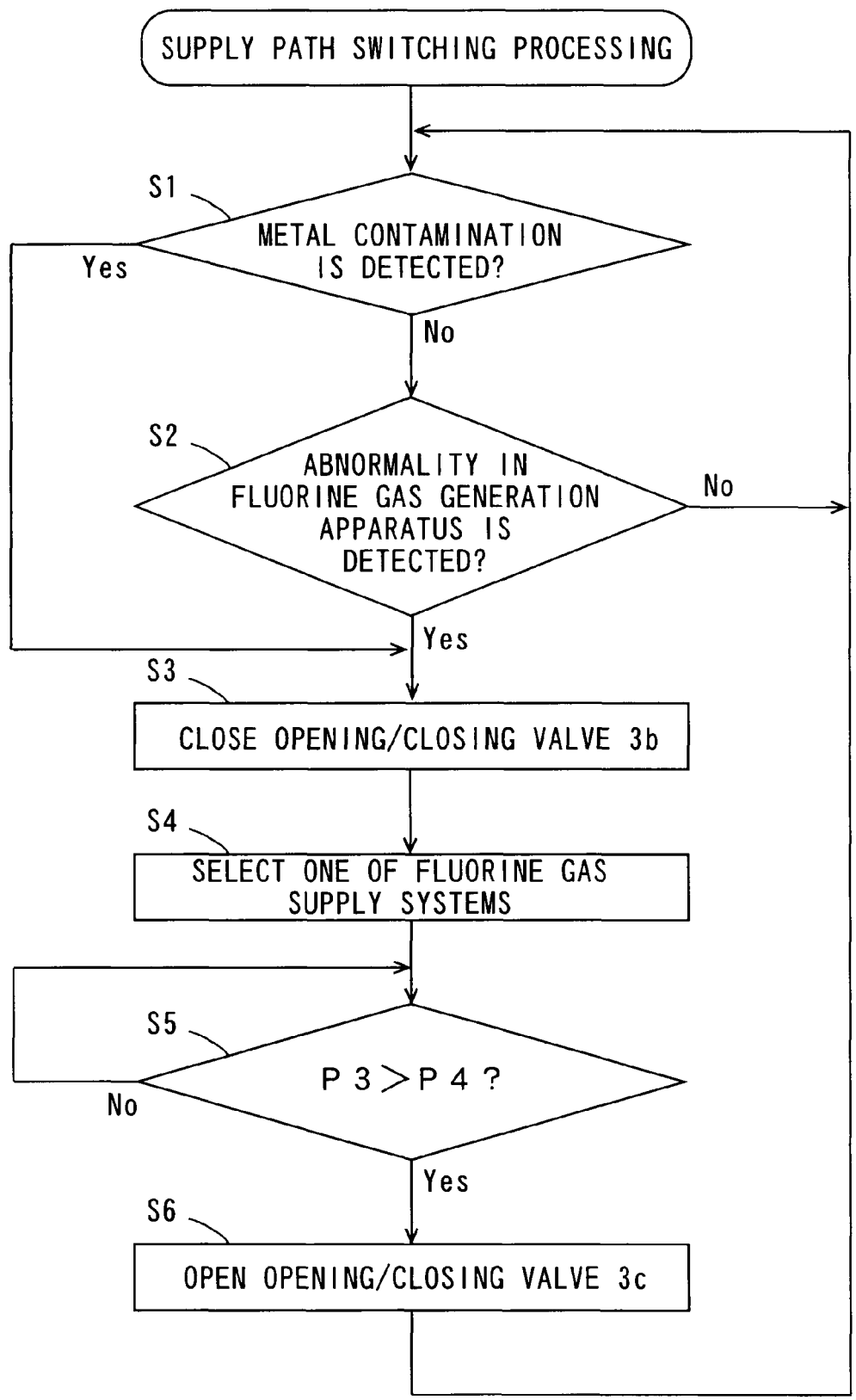
FIG. 3 is a flowchart of supply path switching processing in a controller according to the first embodiment.

The supply path switching processing by the controller 90 will be described in detail below. FIG. 3 is a flowchart of the supply path switching processing by the controller 90 in the fluorine gas supply system 100 according to the first embodiment. In this example, all the fluorine gas supply systems 100a are normally operating as an initial state. Thus, all the opening/closing valves 3b are opened while all the opening/closing valves 3c are closed. In the following description, the normal fluorine gas supply system 100a is referred to as a normal supply system 100a, and the fluorine gas supply system 100a in which an abnormality has occurred is referred to as an abnormal supply system 100a.

As illustrated in FIG. 3, the controller 90 first determines whether any one of the abnormality detection sensors 10 detects metal contamination within the CVD devices 8 (step S1).

If the metal contamination is not detected, the controller 90 determines whether any one of the abnormality detection sensors 11 detects an abnormality in the fluorine gas generation apparatus 50 (step S2). If the abnormality in the fluorine gas generation apparatus 50 is not detected, processing returns to step S1.

If the metal contamination is detected in step S1, or the abnormality in the fluorine gas generation apparatus 50 is detected in step S2, the controller 90 closes the opening/closing valve 3b in the fluorine gas supply system 100a in which the abnormality has occurred (abnormal supply system 100a) (step S3). Thus, the supply of the fluorine gas from the fluorine gas generation apparatus 50 in the abnormal supply system 100a to the CVD devices 8 is stopped.

The controller 90 then selects one of the two fluorine gas supply systems 100a adjacent to the abnormal supply system 100a (step S4). If both the two fluorine gas supply systems 100a adjacent to the abnormal supply system 100a are normally operating, the controller 90 selects one of the fluorine gas supply systems 100a based on their priorities previously stored, for example.

If only one of the fluorine gas supply systems 100a is normally operating, the controller 90 selects the fluorine gas supply system 100a that is normally operating (the normal supply system 100a).

The controller 90 then compares measurement values of the pressure gauges 5c and 5d provided in the piping 4a between the abnormal supply system 100a and the normal supply system 100a selected in step S4. The controller 90 determines whether a measurement value of one, arranged on the side of the normal supply system 100a, of the pressure gauges 5c and 5d (hereinafter referred to as a normal-side pressure value P3) is higher than a measurement value of the pressure gauge arranged on the side of the abnormal supply system 100a (hereinafter referred to as an abnormal-side pressure value P4) (step S5).

If an abnormality has occurred in the fluorine gas supply system 100a illustrated in the upper stage, and the fluorine gas supply system 100a illustrated in the lower stage is normally operating in FIG. 1, for example, the controller 90 determines whether the measurement value of the pressure gauge 5d is higher than the measurement value of the pressure gauge 5c.

In this case, in the abnormal supply system 100a, the supply of the fluorine gas from the fluorine gas generation apparatus 50 is stopped, as described above. Therefore, the abnormal-side pressure value P4 gradually decreases so that the normal-side pressure value P3 becomes higher than the abnormal-side pressure value P4.

If the normal-side pressure value P3 is the abnormal-side pressure value P4 or less, the controller 90 waits until the normal-side pressure value P3 becomes higher than the abnormal-side pressure value P4. When the normal-side pressure value P3 becomes higher than the abnormal-side pressure value P4, the controller 90 opens the opening/closing valve 3c provided in the piping 4a between the abnormal supply system 100a and the normal supply system 100b selected in step S4 (step S6).

In this case, the fluorine gas is supplied from the normal supply system 100a to the plurality of CVD devices 8 connected to the abnormal supply system 100a through the piping 4a. Since the opening/closing valve 3c is opened with the normal-side pressure value P3 being higher than the abnormal-side pressure value P4, the fluorine gas is prevented from flowing back to the normal supply system 100a from the abnormal supply system 100a. Thus, a fluorine gas including metal fluoride is prevented from entering the normal supply system 100a. The processing then returns to step S1.

If metal contamination due to any one of the fluorine gas supply systems 100a has occurred, and if an abnormality in the fluorine gas generation apparatus 50 has occurred in any one of the fluorine gas supply systems 100a, therefore, the opening/closing value 3b in the abnormal supply system 100a is closed while the opening/closing valve 3c in the piping 4a connected to the abnormal supply system 100a is opened.

Thus, the supply of the fluorine gas generated by the abnormal supply system 100a is stopped while the fluorine gas generated by the fluorine gas generation apparatus 50 in the normal supply system 100a is supplied to the plurality of CVD devices 8 connected to the abnormal supply system 100a.

In this state, the fluorine gas generation apparatus 50 in the abnormal supply system 100a is maintained. When the abnormal supply system 100a returns to a normal state, the opening/closing valve 3c, which has been opened in step S6, is closed, and the opening/closing valve 3b, which has been closed in step S3, is opened. In this case, the opening/closing valve 3b is opened with the measurement value of the pressure gauge 5a being higher than the measurement value of the pressure value 5b. Thus, the fluorine gas is prevented from flowing back to the fluorine gas generation apparatus 50.

(1-4) Effects

In the fluorine gas supply system 100 according to the first embodiment, if all the fluorine gas supply systems 100a are normal, the fluorine gas is supplied from the one fluorine gas generation apparatus 50 to each of the plurality of CVD devices 8. In this case, if the metal contamination occurs in any one of the CVD devices 8, the abnormal supply system 100a to be maintained can be easily specified. Therefore, the fluorine gas generation apparatus 50 in the abnormal supply system 100a can be efficiently maintained with the fluorine gas generation apparatus 50 in the normal supply system 100a operated.

If the abnormality has occurred in any one of the fluorine gas supply systems 100a, the supply of the fluorine gas from the fluorine gas generation apparatus 50 in the abnormal supply system 100a to the CVD devices 8 is stopped while the fluorine gas generated by the fluorine gas generation apparatus 50 in the normal supply system 100a is supplied to the CVD devices 8 connected to the abnormal supply system 100a.

Therefore, the abnormal supply system 100a can be maintained while the fluorine gas is continuously supplied to the plurality of CVD devices 8 connected to the abnormal supply system 100a. As a result, the abnormal supply system 100a can be restored to a normal state without interrupting the processing of the substrate in the plurality of CVD devices 8 connected to the abnormal supply system 100a.

Even in a state where the fluorine gas supply path is switched due to the occurrence of the abnormality, the fluorine gas is supplied from the one fluorine gas generation apparatus 50 to each of the CVD devices 8. Even if the metal contamination further occurs in any one of the CVD devices 8 in the state, therefore, the abnormal supply system 100a to be maintained can be easily specified. Therefore, the abnormal supply system 100a can be efficiently maintained.

(1-5) Another Control Example

In an example illustrated in FIG. 3, if an abnormality has occurred in any one of the fluorine gas supply systems 100a, a fluorine gas is supplied from one of the fluorine gas supply systems 100a adjacent to the abnormal supply system 100a to the abnormal supply system 100a. In this case, if both the two fluorine gas supply systems 100a adjacent to the abnormal supply system 100a are normal, the fluorine gas may be supplied from both the normal supply systems 100a to the abnormal supply system 100a. Thus, a sufficient fluorine gas is supplied to the CVD devices 8 connected to the abnormal supply system 100a.

(2) Second Embodiment

A fluorine gas supply system 100 according to a second embodiment of the present invention will be described by referring to differences from the above-mentioned fluorine gas supply system 100 according to the first embodiment.

(2-1) Configuration of Fluorine Gas Supply System

Figure 4:
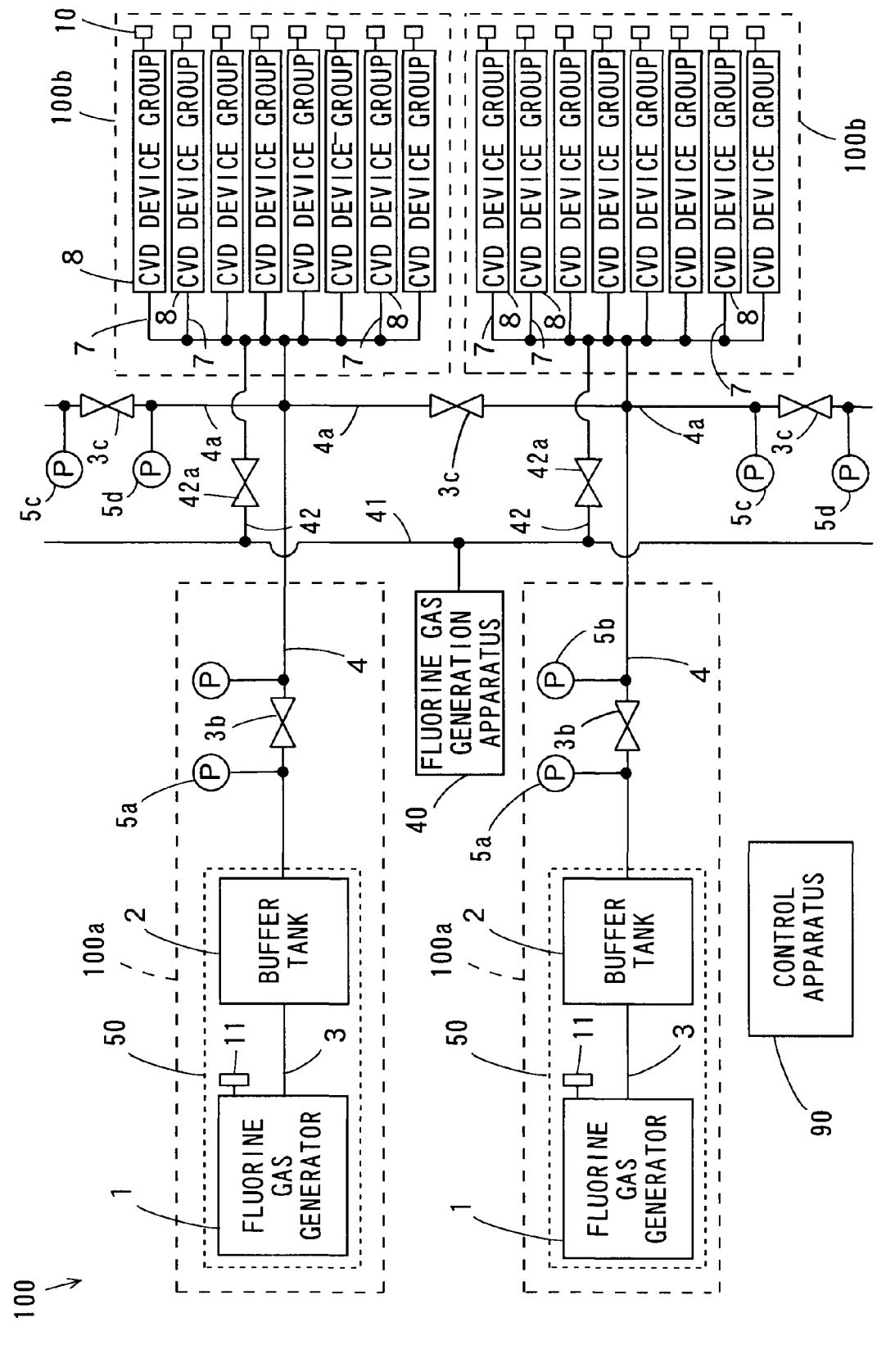
FIG. 4 is a schematic view illustrating a configuration of a fluorine gas supply system according to a second embodiment.

FIG. 4 is a schematic view illustrating a configuration of the fluorine gas supply system 100 according to the second embodiment. As illustrated in FIG. 4, the fluorine gas supply system 100 according to the second embodiment includes a fluorine gas generation apparatus 40 for backup. The fluorine gas generation apparatus 40 has a similar configuration to a fluorine gas generation apparatus 50. The fluorine gas generation apparatus 40 need not include a buffer tank 2.

A piping 41 is connected to the fluorine gas generation apparatus 40. The piping 41 is branched into a plurality of pipings 42 respectively corresponding to a plurality of fluorine gas supply systems 100a. An opening/closing valve 42a is inserted into the piping 42. Each of the pipings 42 is connected to a plurality of pipings 7 respectively corresponding to a plurality of CVD devices 8 in the corresponding fluorine gas supply system 100a.

(2-2) Control System of Fluorine Gas Supply System

Figure 5:
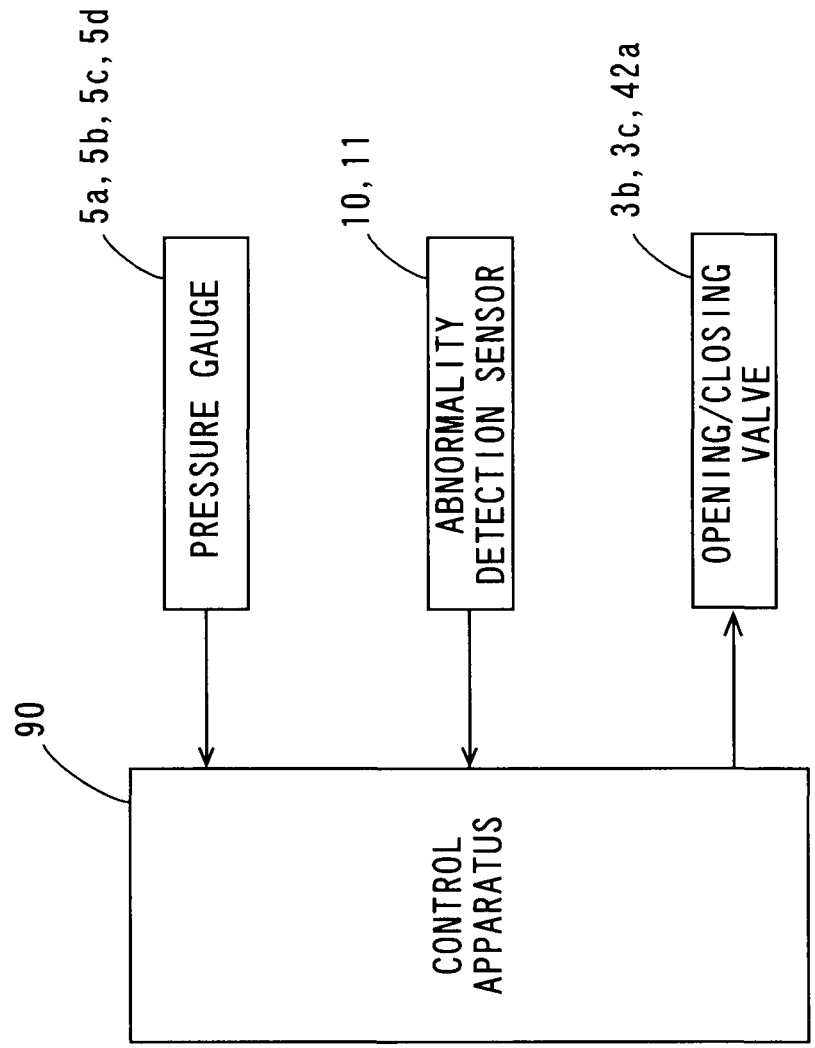
FIG. 5 is a block diagram illustrating a part of a control system in the fluorine gas supply system according to the second embodiment.

FIG. 5 is a block diagram illustrating a part of a control system in the fluorine gas supply system 100 illustrated in FIG. 4. As illustrated in FIG. 5, output signals are fed to a controller 90 from pressure gauges 5a to 5d and abnormality detection sensors 10 and 11. The controller 90 controls opening/closing valves 3b, 3c, and 42a based on the output signals fed from the pressure gauges 5a to 5d and the abnormality detection sensors 10 and 11.

(2-3) Control of Opening/Closing Valve

In the second embodiment, if all the fluoride gas supply systems 100a are normally operating, all the opening/closing valves 3b are opened while all the opening/closing valves 3c and 42a are closed. Thus, a fluorine gas generated by each of the fluorine gas generation apparatuses 50 in all the fluorine gas supply systems 100a is supplied to the plurality of CVD devices 8 through the pipings 4 and 7.

On the other hand, if an abnormality has occurred in any one of the fluorine gas supply systems 100a, the corresponding opening/closing valve 3b is selectively closed while the corresponding opening/closing valve 42a is selectively opened. Thus, a fluorine gas generated by the fluorine gas generation apparatus 40 for backup is supplied to the plurality of CVD devices 8 connected to the abnormal supply system 100a through the pipings 41, 42 and 7.

Figure 6:
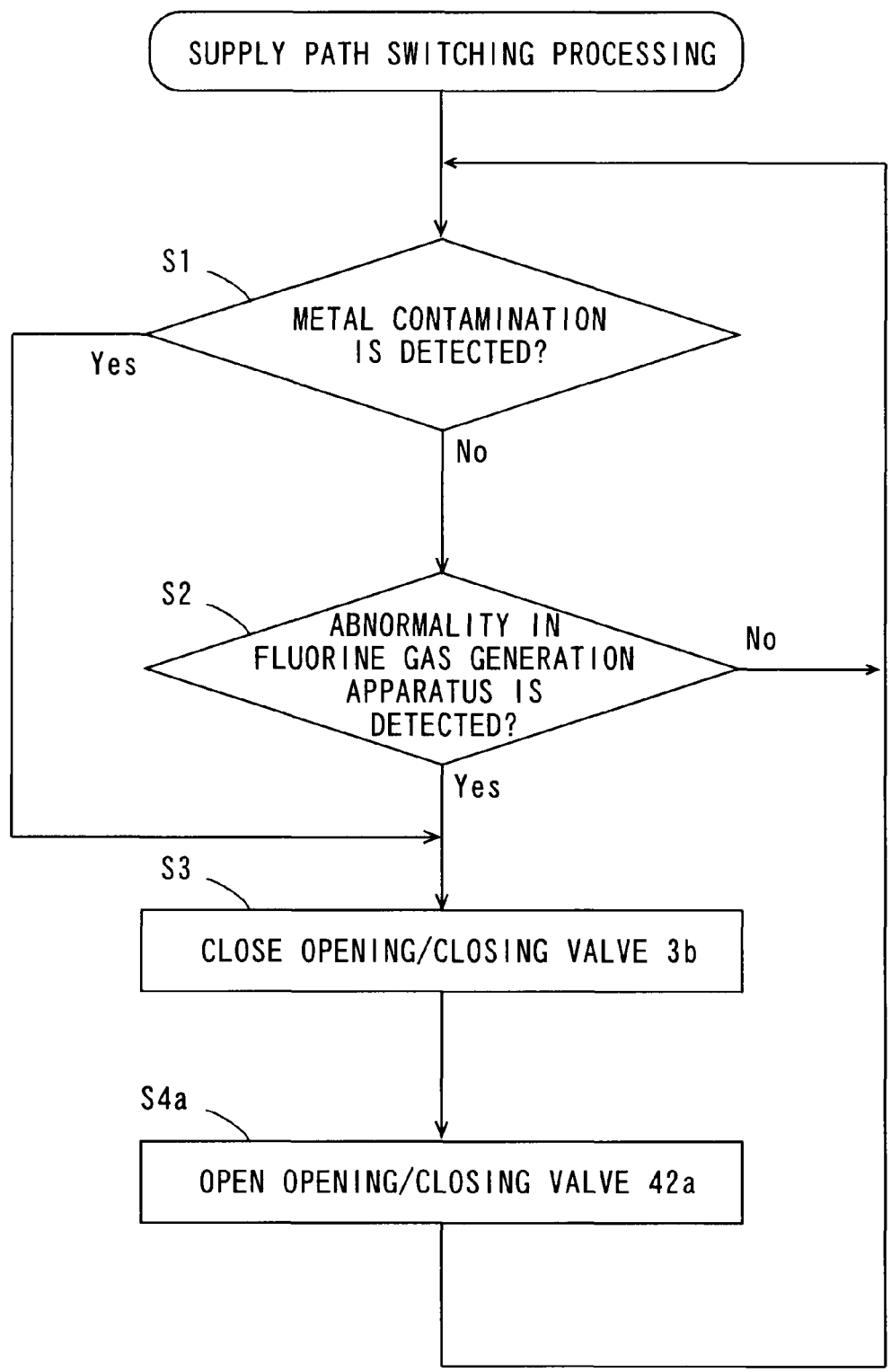
FIG. 6 is a flowchart of supply path switching processing by a controller according to the second embodiment.

FIG. 6 is a flowchart illustrating supply path switching processing by the controller 90 in the fluorine gas supply system 100 according to the second embodiment. In the present embodiment, all the fluorine gas supply systems 100a are normally operating as an initial state, and all the opening/closing valves 3b are opened while all the opening/closing valves 3c and 42a are closed.

Processes in steps S1 to S3 illustrated in FIG. 6 are similar to the processes in steps S1 to S3 illustrated in FIG. 3. The controller 90 closes the opening/closing valve 3b in the abnormal supply system 100a in step S3, and then opens the opening/closing valve 42a corresponding to the abnormal supply system 100a (step S4a).

In this case, the fluorine gas is supplied from the fluorine gas generation apparatus 40 to the plurality of CVD devices 8 connected to the abnormal supply system 100a through the pipings 41, 42 and 7. The processing then returns to step S1.

If metal contamination has occurred due to any one of the fluorine gas supply systems 100a, and if an abnormality in the fluorine gas supply system 50 has occurred in any one of the fluorine gas supply systems 100a, therefore, the opening/closing valve 3b in the abnormal supply system 100a is closed while the opening/closing valve 42a in the piping 42 connected to the plurality of CVD devices 8 connected to the abnormal supply system 100a is opened.

Thus, the supply of the fluorine gas generated by the fluorine gas generation apparatus 50 in the abnormal supply system 100a is stopped while the fluorine gas generated by the fluorine gas generation apparatus 40 for backup is supplied to the plurality of CVD devices 8 connected to the abnormal supply system 100a.

In this state, the abnormal supply system 100a is maintained. When the abnormal supply system 100a is restored to a normal state, the opening/closing valve 42a, which has been opened in step S4a, is closed, and the opening/closing valve 3b, which has been closed in step S3, is opened.

(2-4) Effects

In the fluorine gas supply system 100 according to the second embodiment, if the abnormality has occurred in any one of the fluorine gas supply systems 100a, the supply of the fluorine gas from the fluorine gas generation apparatus 50 in the abnormal supply system 100a to the plurality of CVD devices 8 is stopped while the fluorine gas is supplied from the fluorine gas generation apparatus 40 for backup to the plurality of CVD devices 8 connected to the abnormal supply system 100a. Therefore, the abnormal supply system 100a can be maintained while the fluorine gas is continuously supplied to the plurality of CVD devices 8 connected to the abnormal supply system 100a. As a result, the abnormal supply system 100a can be restored to a normal state without interrupting the processing of the substrate in the plurality of CVD devices 8 connected to the abnormal supply system 100a.

(2-5) Another Example of Control

If an abnormality has occurred in any one of the fluorine gas supply systems 100a, as in the first embodiment, the corresponding opening/closing valve 3c is selectively opened so that the fluorine gas may be supplied from the normal supply system 100a to the plurality of CVD devices 8 connected to the abnormal supply system 100a. In this case, a sufficient amount of fluorine gas is supplied to the plurality of CVD devices 8 connected to the abnormal supply system 100a.

(3) Third Embodiment

A fluorine gas supply system 100 according to a third embodiment will be described by referring to differences from the above-mentioned fluorine gas supply system 100 according to the first embodiment.

(3-1) Configuration of Fluorine Gas Supply System

Figure 7:
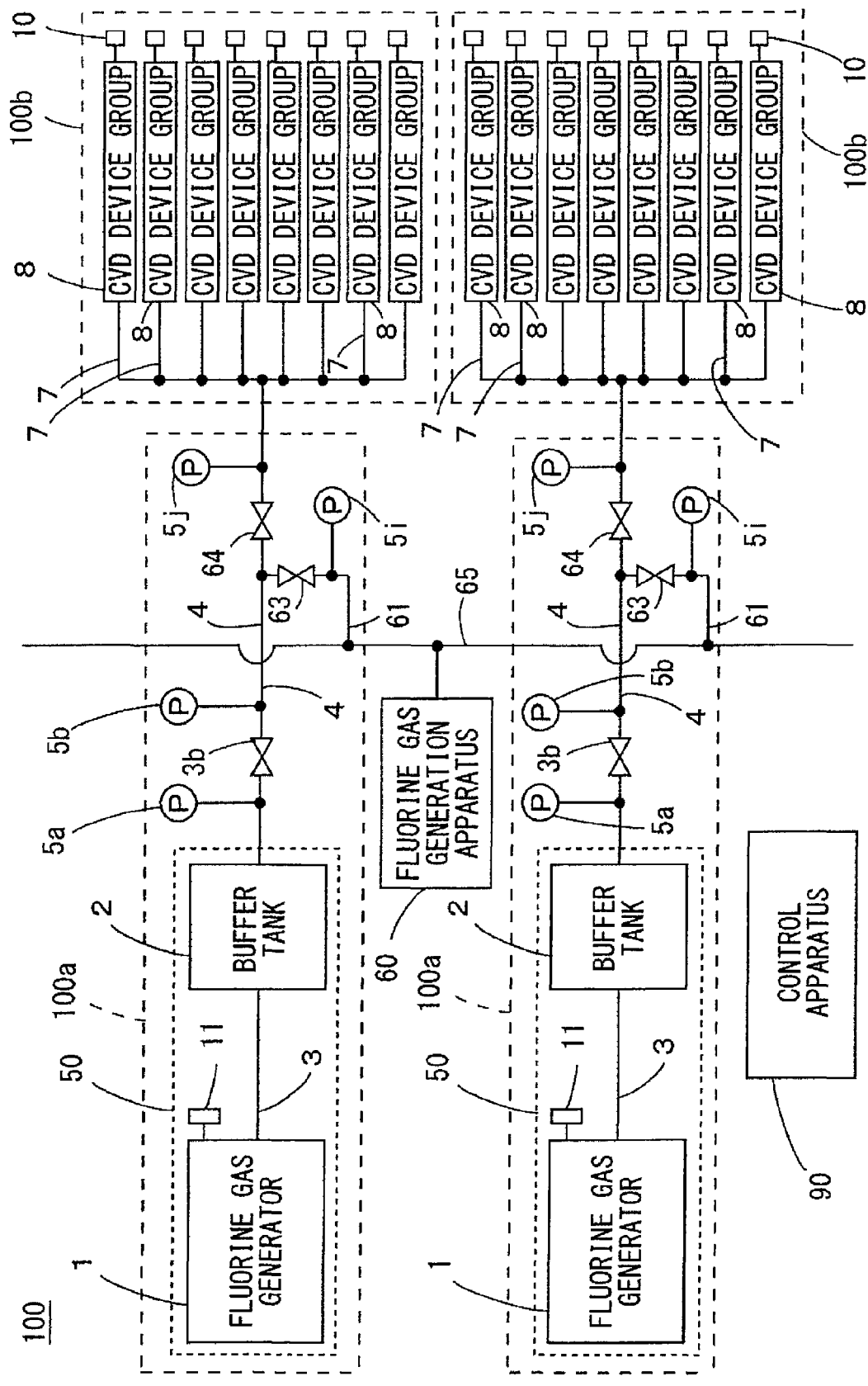
FIG. 7 is a schematic view illustrating a configuration of a fluorine gas supply system according to a third embodiment.

FIG. 7 is a schematic view illustrating a configuration of the fluorine gas supply system 100 according to the third embodiment. As illustrated in FIG. 7, the fluorine gas supply system 100 according to the third embodiment includes a fluorine gas generation apparatus 60 for backup. The fluorine gas generation apparatus 60 has a similar configuration to a fluorine gas generation apparatus 50. The fluorine gas generation apparatus 60 need not include a buffer tank 2. A piping 65 is connected to the fluorine gas generation apparatus 60. A piping 4 in each of fluorine gas supply systems 100*a* is connected to the piping 65 via a piping 61 at a position on the downstream side of a pressure gauge 5*b*. An opening/closing valve 63 is inserted through each of the pipings 61. An opening/closing valve 64 is inserted at a position, on the downstream side of a connection point with the piping 61, of the piping 4. A pressure gauge 5*j* is attached to a portion of the piping 4 between the opening/closing valve 64 and the pipings 7. A pressure gauge 5*i* is attached to a portion of the piping 61 between the opening/closing valve 63 and the piping 65.

(3-2) Control System of Fluorine Gas Supply System

Figure 8:
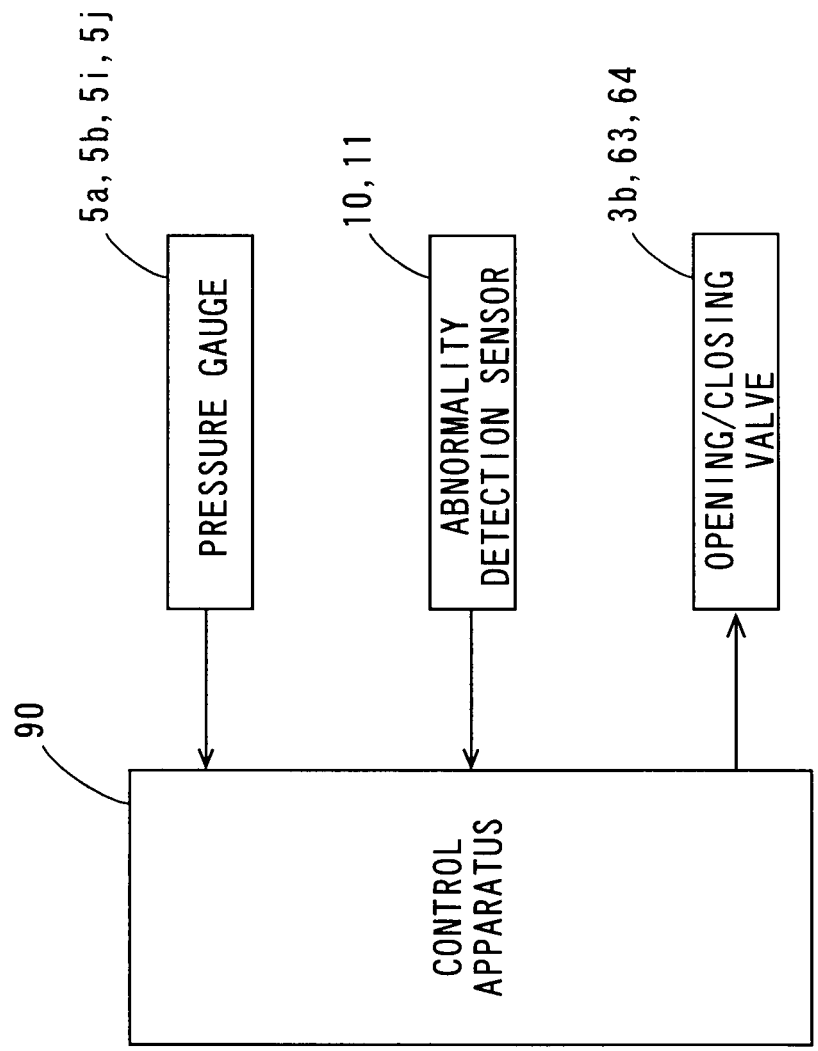
FIG. 8 is a block diagram illustrating a part of a control system in the fluorine gas supply system according to the third embodiment.

FIG. 8 is a block diagram illustrating a part of a control system in the fluorine gas supply system 100 illustrated in FIG. 7. As illustrated in FIG. 8, output signals of pressure gauges 5*a*, 5*b*, 5*i* and 5*j* and abnormality detection sensors 10 and 11 are fed to a controller 90. The controller 90 controls the opening/closing valves 3*b*, 63 and 64 based on the output signals fed from the pressure gauges 5*a*, 5*b*, 5*i* and 5*j* and the abnormality detection sensors 10 and 11.

(3-3) Control of Opening/Closing Valve

In the third embodiment, if all fluorine gas supply systems 100*a* are normally operating, all the opening/closing valves 3*b* and 64 are opened while all the opening/closing valves 63 are closed. Thus, a fluorine gas generated by each of the fluorine gas generation apparatuses 50 in all the fluorine gas supply systems 100*a* is supplied to the plurality of CVD devices 8 through the pipings 4 and 7.

On the other hand, if an abnormality has occurred in any one of the fluorine gas supply systems 100*a*, the corresponding opening/closing valve 3*b* is selectively closed while the corresponding opening/closing valve 63 is selectively opened. Thus, a fluorine gas generated by the fluorine gas generation apparatus 60 is supplied to the plurality of CVD devices 8 connected to the abnormal supply system 100*a* through the pipings 65, 61, 4 and 7.

Figure 9:
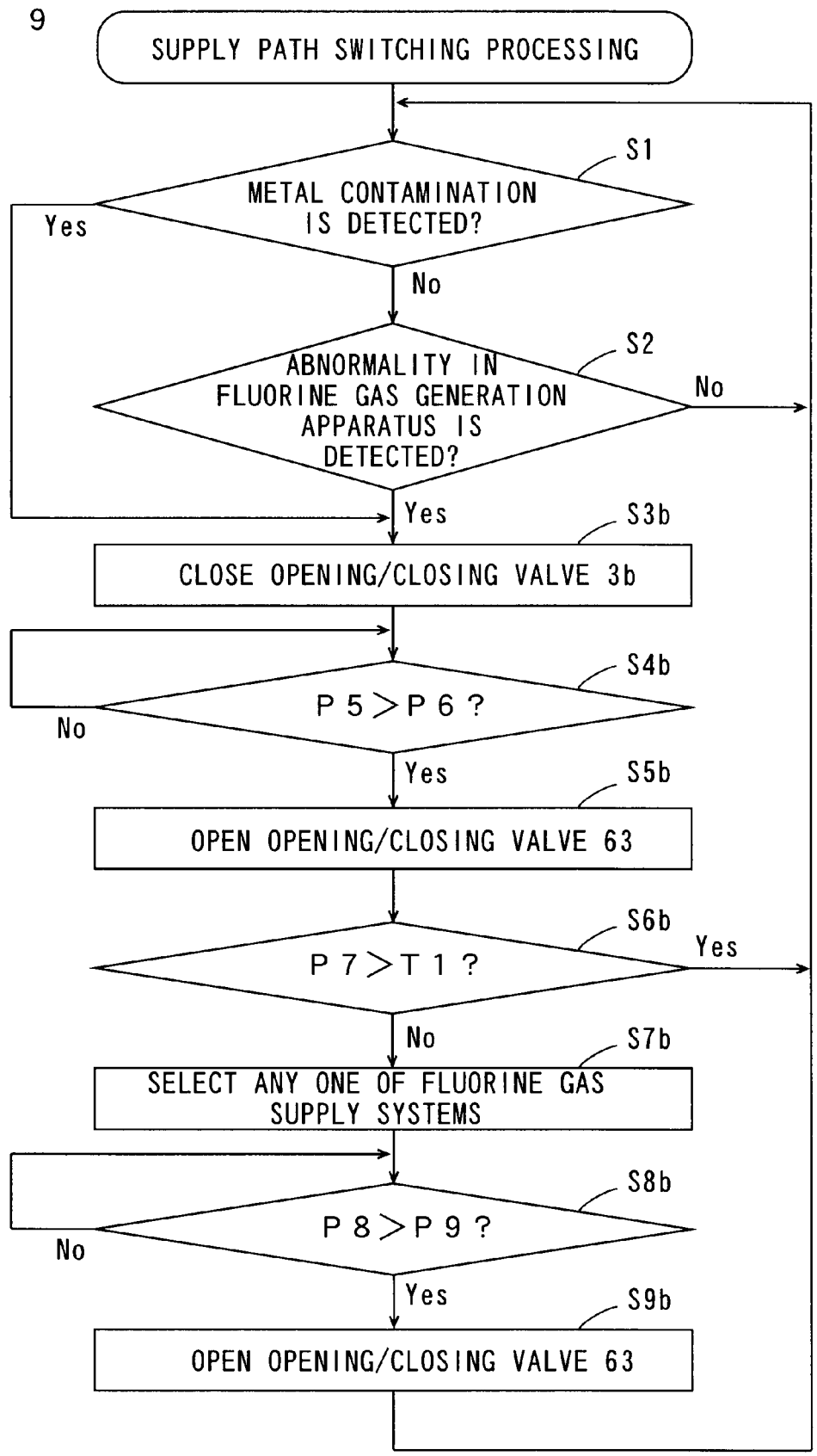
FIG. 9 is a flowchart of supply path switching processing by a controller according to the third embodiment.

FIG. 9 is a flowchart illustrating supply path switching processing by the controller 90 in the fluorine gas generation system 100 according to the third embodiment. In the present embodiment, all the fluorine gas supply systems 100*a* are normally operating as an initial state, and all the opening/closing valves 3*b* and 64 are opened while all the opening/closing valves 63 are closed.

Processes in steps S1 and S2 illustrated in FIG. 9 are similar to the processes in steps S1 and S2 illustrated in FIG. 3. If any one of the abnormality detection sensors 10 detects metal contamination within the CVD devices 8 in step S1, or if any one of the abnormality detection sensors 11 detects an abnormality in the fluorine gas generation apparatus 50 in step S2, the controller 90 closes the opening/closing valve 3*b* in the abnormal supply system 100*a* (step S3*b*). Thus, the supply of the fluorine gas from the fluorine gas generation apparatus 50 in the abnormal supply system 100*a* is stopped.

The controller 90 then compares a measurement value of the pressure gauge 5*i* provided in the piping 61 in the abnormal supply system 100*a* (hereinafter referred to as a backup-side pressure value P5) with a measurement value of the pressure gauge 5*b* provided in the piping 4 in the abnormal supply system 100*a* (hereinafter referred to as an abnormal-side pressure value P6).

The controller 90 determines whether the backup-side pressure value P5 is higher than the abnormal-side pressure value P6 (step S4*b*).

In this case, in the abnormal supply system 100*a*, the supply of the fluorine gas from the fluorine gas generation apparatus 50 is stopped, as described above. Therefore, the abnormal-side pressure value P6 gradually decreases. Therefore, the backup-side pressure value P5 becomes higher than the abnormal-side pressure value P6.

If the backup-side pressure value P5 is the abnormal-side pressure value P6 or less, the controller 90 waits until the backup-side pressure value P5 becomes higher than the abnormal-side pressure value P6. When the backup-side pressure value P5 becomes higher than the abnormal-side pressure value P6, the controller 90 opens the opening/closing valve 63 in the abnormal supply system 100*a* (step S5*b*).

In this case, then fluorine gas is supplied from the fluorine gas generation apparatus 60 to the plurality of CVD devices 8 connected to the abnormal supply system 100*a* through the pipings 65, 61, 4 and 7. Since the opening/closing valve 63 is opened with the backup-side pressure value P5 being higher than the abnormal-side pressure value P6, the fluorine gas is prevented from flowing back from the abnormal supply system 100*a* to the piping 65. Thus, a fluorine gas including metal fluoride is prevented from entering the fluorine gas generation apparatus 60.

The controller 90 then determines whether pressure in the piping 65 (hereinafter referred to as a supply pressure value P7) is higher than a threshold value T1 previously determined (step S6*b*). As the pressure in the piping 65, a measurement value of the pressure gauge 5*j* in the abnormal supply system 100*a* may be used, a measurement value of the pressure gauge 5*b* in the abnormal supply system 100*a* may be used, or a measurement value of the pressure gauge 5*i* in the abnormal supply system 100*a* may be used. In this case, it is determined whether the fluorine gas is sufficiently supplied to the plurality of CVD devices 8 connected to the abnormal supply system 100*a*. If the supply pressure value P7 is higher than a threshold value T1, the processing returns to step S1.

If the supply pressure value P7 is the threshold value or less, the controller 90 selects any one of the normal supply systems 100*a* based on their priorities previously stored, for example (step S7*b*). The controller 90 then compares a measurement value of the pressure gauge 5*b* in the selected normal supply system 100*a* (hereinafter referred to as a normal-side pressure value P8) with a pressure value of the pressure gauge 5*i* in the selected normal supply system 100*a* (hereinafter referred to as a backup-side pressure value P9). The controller 90 determines whether the normal-side pressure value P8 is higher than the backup-side pressure value P9 (step S8*b*).

If the normal-side pressure value P8 is the backup-side pressure value P9 or less, the controller 90 waits until the normal-side pressure value P8 becomes higher than the backup-side pressure value P9. When the normal-side pressure value P8 becomes higher than the backup-side pressure value P9, the controller 90 opens the opening/closing value 63 provided in the piping 61 in the normal supply system 100a selected in step S7b (step S9b). Then, the processing returns to step S1.

In this case, the fluorine gas is supplied from the fluorine gas generation apparatus 50 in the normal supply system 100a to the plurality of CVD devices 8 connected to the abnormal supply system 100a through the pipings 4, 61, 65, 4 and 7. Since the opening/closing valve 63 is opened with the normal-side pressure value P8 being higher than the backup-side pressure value P9, the fluorine gas is prevented from flowing back to the normal supply system 100a.

(3-4) Effects

In the fluorine gas supply system 100 according to the third embodiment, if the abnormality has occurred in any one of the fluorine gas supply systems 100a, the supply of the fluorine gas from the fluorine gas generation apparatus 50 in the abnormal supply system 100a is stopped while the fluorine gas is supplied from the fluorine gas generation apparatus 60 for backup to the plurality of CVD devices 8 connected to the abnormal supply system 100a. Therefore, the abnormal supply system 100a can be maintained while the fluorine gas is continuously supplied to the plurality of CVD devices 8 connected to the abnormal supply system 100a. As a result, the abnormal supply system 100a can be restored to a normal state without interrupting the processing of the substrate in the plurality of CVD devices 8 connected to the abnormal supply system 100a.

If abnormalities respectively have occurred in the plurality of fluorine gas supply systems 100a, the fluorine gas is supplied from the fluorine gas generation apparatus 60 to the plurality of CVD devices 8 connected to each of the plurality of abnormal supply systems 100a. An amount of generation of the fluorine gas in the fluorine gas generation apparatus 60 is constant. If the fluorine gas is supplied from the fluorine gas generation apparatus 60 to the plurality of CVD devices 8 connected to each of the plurality of abnormal supply systems 100a, the fluorine gas to be supplied may be insufficient.

In the present embodiment, if the fluorine gas supplied to the CVD devices 8 is insufficient, a fluorine gas is further supplied from the normal supply system 100a to the plurality of CVD devices 8 connected to the abnormal supply system 100a. Even if abnormalities respectively occur in the plurality of fluorine gas supply systems 100a, a sufficient amount of fluorine gas is supplied to the plurality of CVD devices 8 connected to each of the abnormal supply systems 100a.

If processing using a fluorine gas is not performed in a CVD device group 100b connected to each of the one or plurality of fluorine gas supply systems 100a, the opening/closing valve 64 in the fluorine gas supply system 100a may be closed while the opening/closing valve 63 in the fluorine gas supply system 100a and the opening/closing valve 63 in the other fluorine gas supply system 100a may be opened.

In this case, a fluorine gas can be supplied from the fluorine gas supply system 100a, which need not supply a fluorine gas to the CVD device group 100b, to the other fluorine gas supply system 100a through the pipings 61, 65 and 61. Thus, the CVD device group 100b can supply a more sufficient amount of fluorine gas from the other fluorine gas supply system 100a to the CVD device group 100b.

(4) Correspondences Between Elements in the Claims and Parts in Embodiments

In the following paragraphs, non-limiting examples of correspondences between various elements recited in the claims below and those described above with respect to various preferred embodiments of the present invention are explained.

In the embodiments, described above, the CVD device 8 is an example of a processing device, the fluorine gas supply system 100 is an example of a gas supply system, the fluorine gas generation apparatus 50 is an example of a first gas generation apparatus, the pipings 4 and 7 are examples of a first piping, the opening/closing valve 3b is an example of a first opening/closing unit, the piping 4a is an example of a second piping, the opening/closing value 3c is an example of a second opening/closing unit, the controller 90 is an example of a controller, the fluorine gas generation apparatus 40 is an example of a second gas generation apparatus, the pipings 41 and 42 are examples of a third piping, the opening/closing valve 42a is an example of a third opening/closing unit, the fluorine gas generation apparatus 60 is an example of a third gas generation apparatus, the piping 65 is an example of a fourth piping, the piping 61 is an example of a fifth piping, and the opening/closing valve 63 is an example of a fourth opening/closing unit.

As each of various elements recited in the claims, various other elements having configurations or functions described in the claims can be also used.

INDUSTRIAL APPLICABILITY

The present invention is applicable to supply of a gas to various processing devices.

The invention claimed is:

1. A gas supply system that supplies gases to first and separate second processing device groups, each comprising a processing device or a plurality of processing devices that respectively perform processing with the gases, the system comprising:
   first and second gas generation apparatuses, each comprising an electrolyzer configured to generate a gas by electrolysis within an electrolytic bath;
   a first base piping configured to connect the first gas generation apparatus with the first processing device group;
   a second base piping provided separately from the first base piping and configured to connect the second gas generation apparatus with the second processing device group;
   a first base opening/closing unit provided in said first base piping for opening and closing a flow path;
   a second base opening/closing unit provided in said second base piping for opening and closing a flow path;
   an auxiliary piping configured to connect said first base piping with said second base piping; and
   an auxiliary opening/closing unit provided in said auxiliary piping for opening and closing a flow path.

2. The gas supply system according to claim 1, further comprising a controller that controls opening and closing of each of said first and second base opening/closing units and said auxiliary opening/closing unit,
   wherein said controller is configured to bring, when the first base opening/closing unit is brought into a closed state, said auxiliary opening/closing unit into an open state so that the gas is supplied to the first processing device group from the second gas generation apparatus.

3. The gas supply system according to claim 2, wherein said controller is configured to bring, when the first base opening/closing unit is brought into a closed state, said auxiliary opening/closing unit into an open state when pressure on the upstream side of said auxiliary opening/closing unit becomes higher than pressure on the downstream side thereof.

4. A gas supply system that supplies gases to first and separate second processing device groups, each comprising one or a plurality of processing devices that perform processing with the gases, the system comprising:
- first and second gas generation apparatuses, each comprising an electrolyzer configured to generate a gas by electrolysis within an electrolytic bath;
- a first base piping, configured to connect the first gas generation apparatus with the first processing device group;
- a second base piping provided separately from the first base piping and configured to connect the second gas generation apparatus with the second processing device group;
- a first base opening/closing unit provided in said first piping for opening and closing a flow path;
- a second base opening/closing unit provided in said second base piping for opening and closing a flow path;
- an auxiliary gas generation apparatus comprising an electrolyzer configured to generate a gas by electrolysis within an electrolytic bath;
- first and second supply pipings that respectively supply the gas generated by said auxiliary gas generation apparatus to said first and second processing device groups; and
- first and second supply opening/closing units respectively provided in said first and second supply pipings for opening and closing flow paths.

5. The gas supply system according to claim 4, further comprising a controller that controls an opening/closing operation of each of said first and second base opening/closing units and said first and second supply opening/closing units,
wherein said controller is configured to bring, when said first base opening/closing unit is brought into a closed state, the first supply opening/closing unit into an open state so that the gas is supplied from said auxiliary gas generation apparatus to the first processing device group, and configured to bring, when said second base opening/closing unit is brought into a closed state, the second supply opening/closing unit into an open state so that the gas is supplied from said auxiliary gas generation apparatus to the second processing device group.

6. A gas supply system that supplies gases to first and separate second processing device groups, each comprising one or a plurality of processing devices that perform processing with the gases, the system comprising:
- first and second gas generation apparatuses, each comprising an electrolyzer configured to generate a gas by electrolysis within an electrolytic bath;
- a first base piping, configured to connect the first gas generation apparatus with the first processing device group;
- a second base piping provided separately from the first base piping and configured to connect the second gas generation apparatus with the second processing device group;
- a first base opening/closing unit provided in said first base piping for opening and closing a flow path;
- a second base opening/closing unit provided in said second base piping for opening and closing a flow path;
- an auxiliary gas generation apparatus comprising an electrolyzer configured to generate a gas by electrolysis within an electrolytic bath;
- a supply piping extending from said auxiliary gas generation apparatus;
- a first auxiliary piping configured to connect said supply piping with a portion on a downstream side of said first base opening/closing unit of said first base piping;
- a second auxiliary piping configured to connect said supply piping with a portion, on a downstream side of said second base opening/closing unit, of said second base piping; and
- first and second auxiliary opening/closing units respectively provided in said first and second auxiliary pipings for opening and closing flow paths.

7. The gas supply system according to claim 6, further comprising a controller that controls an opening/closing operation of each of said first and second base opening/closing units and said first and second auxiliary opening/closing units,
wherein said controller is configured to bring, when said first base opening/closing unit is brought into a closed state, the first auxiliary opening/closing unit into an open state so that the gas is supplied from said auxiliary gas generation apparatus to the first processing device group, and configured to bring, when said second base opening/closing unit is brought into a closed state, the second auxiliary opening/closing unit into an open state so that the gas is supplied from said auxiliary gas generation apparatus to the second processing device group.

8. The gas supply system according to claim 7, wherein said controller is configured to bring, when the first base opening/closing unit is brought into a closed state, the first auxiliary opening/closing unit into an open state when pressure on the upstream side of said first auxiliary opening/closing unit becomes higher than pressure on the downstream side thereof, and configured to bring, when the second base opening/closing unit is brought into a closed state, the second auxiliary opening/closing unit into an open state when pressure on the upstream side of said second auxiliary opening/closing unit becomes higher than pressure on the downstream side thereof.

9. The gas supply system according to claim 7, wherein said controller is configured to bring, when the first auxiliary opening/closing unit is brought into an open state, the second auxiliary opening/closing unit into an open state so that the gas is supplied to the first processing device group from the second gas generation apparatus when pressure in said supply piping is lower than a predetermined value.

10. The gas supply system according to claim 9, wherein said controller is configured to bring, when the first auxiliary opening/closing unit is brought into an open state, the second auxiliary opening/closing unit into an open state when pressure on the upstream side of the second auxiliary opening/closing unit becomes higher than pressure on the downstream side thereof.

* * * * *

UNITED STATES PATENT AND TRADEMARK OFFICE
CERTIFICATE OF CORRECTION

PATENT NO. : 9,109,288 B2  
APPLICATION NO. : 13/393895  
DATED : August 18, 2015  
INVENTOR(S) : Osamu Yoshimoto Page 1 of 1

It is certified that error appears in the above-identified patent and that said Letters Patent is hereby corrected as shown below:

On the title page, Item 75, "Osamu Yoshimoto, Osaka (JP)" should read --Osamu Yoshimoto, Kagawa (JP)--

On the title page, Item 56 should additionally list the following U.S. Patent Document
--2001/0007244 A1* 7/2001 Matsuse--

Signed and Sealed this  
Second Day of August, 2016

Michelle K. Lee  
*Director of the United States Patent and Trademark Office*